United States Patent
Soumiya

(10) Patent No.: US 11,339,312 B2
(45) Date of Patent: May 24, 2022

(54) POLISHING COMPOSITION, PRODUCTION METHOD OF THE SAME, POLISHING METHOD, AND MANUFACTURING METHOD OF SEMICONDUCTOR SUBSTRATE

(71) Applicant: FUJIMI INCORPORATED, Kiyosu (JP)

(72) Inventor: Akiko Soumiya, Kiyosu (JP)

(73) Assignee: FUJIMI INCORPORATED, Kiyosu (JP)

(*) Notice: Subject to any disclaimer, the term of this patent is extended or adjusted under 35 U.S.C. 154(b) by 0 days.

(21) Appl. No.: 17/208,803

(22) Filed: Mar. 22, 2021

(65) Prior Publication Data
US 2021/0301176 A1    Sep. 30, 2021

(30) Foreign Application Priority Data

Mar. 25, 2020 (JP) .............................. JP2020-054516
Nov. 30, 2020 (JP) .............................. JP2020-198712

(51) Int. Cl.
*C09G 1/02* (2006.01)
*H01L 21/3105* (2006.01)
*H01L 21/306* (2006.01)

(52) U.S. Cl.
CPC .......... *C09G 1/02* (2013.01); *H01L 21/30625* (2013.01); *H01L 21/31053* (2013.01)

(58) Field of Classification Search
None
See application file for complete search history.

(56) References Cited

U.S. PATENT DOCUMENTS

2007/0105976 A1* 5/2007 Nishiguchi ............. C07C 61/29
                                                                    523/122
2011/0136344 A1   6/2011 Reiss et al.

FOREIGN PATENT DOCUMENTS

JP    2014-505358 A    2/2014
WO    WO-2012/083115 A    6/2012

* cited by examiner

*Primary Examiner* — Roberts P Culbert
(74) *Attorney, Agent, or Firm* — Foley & Lardner LLP

(57) ABSTRACT

The present invention provides means capable of improving an effect of inhibiting polishing of silicon nitride. The present invention relates to a polishing composition containing a cationically modified silica particles, a non-aromatic crosslinked cyclic compound having an organic acid group or a group of a salt thereof, and water.

17 Claims, No Drawings

POLISHING COMPOSITION, PRODUCTION METHOD OF THE SAME, POLISHING METHOD, AND MANUFACTURING METHOD OF SEMICONDUCTOR SUBSTRATE

CROSS-REFERENCE TO RELATED APPLICATION

The entire disclosure of Japanese Patent Application No. 2020-54516 filed on Mar. 25, 2020, and the Japanese patent application No. 2020-198712 filed on Nov. 30, 2020, are incorporated herein by reference in its entirety.

BACKGROUND

1. Technical Field

The present invention relates to a polishing composition, a production method of the same, a polishing method, and a manufacturing method of a semiconductor substrate.

2. Description of Related Arts

In recent years, in accordance with multilayer wiring on a surface of a semiconductor substrate, a so-called chemical mechanical polishing (CMP) technique for polishing and planarizing a semiconductor substrate is used in manufacturing of a device. CMP is a method of planarizing a surface of an object to be polished such as a semiconductor substrate or the like by using a polishing composition (slurry) containing abrasive grains of silica, alumina, ceria, or the like, an anticorrosive, a surfactant, or the like. In this case, the object to be polished is a film containing silicon, polysilicon, silicon oxide, silicon nitride, titanium nitride, titanium, tantalum nitride, tantalum, or the like, a wiring or a plug including a metal such as copper or tungsten, or the like.

In the CMP technique, silicon nitride is used as a stopper film (etching mask), and in this case, a ratio of a polishing speed of a material other than silicon nitride (hereinafter, in the present specification, also simply referred to as "another material") to a polishing speed of silicon nitride (a selection ratio of the another material to silicon nitride) is preferably large. Regarding polishing of an object to be polished in which silicon nitride is used as a stopper film, JP 2014-505358 A (corresponding to WO 2012/083115 A) discloses a chemical-mechanical polishing composition consisting of silica, aminophosphonic acid, polysaccharide, a tetraalkylammonium salt, a bicarbonate salt, a compound having an azole ring, potassium hydroxide which is an optional component, and water, and having a pH of 7 to 11. JP 2014-505358 A (corresponding to WO 2012/083115 A) discloses that when polishing is performed by using the chemical-mechanical polishing composition at a high polishing pressure, a selection ratio of polysilicon to silicon nitride which is a stopper film and a selection ratio of polysilicon to silicon oxide which is an insulating film are increased.

SUMMARY

However, in the chemical-mechanical polishing composition of JP 2014-505358 A (corresponding to WO 2012/083115 A), the effect of inhibiting polishing of silicon nitride is insufficient, and a selection ratio of another material to silicon nitride is also insufficient. In addition, it is necessary to take measures such as increasing of a thickness of a silicon nitride film in consideration of a loss or the like.

An object of the present invention is to provide means capable of improving an effect of inhibiting polishing of silicon nitride.

According to an aspect of the present invention, a polishing composition contains cationically modified silica particles, a non-aromatic crosslinked cyclic compound having an organic acid group or a group of a salt thereof, and water.

DETAILED DESCRIPTION

Hereinafter, embodiments of the present invention will be described. Note that the present invention is not limited to only the following embodiments. In addition, in the present specification, "X to Y" representing a range means "X or more and Y or less". In addition, unless otherwise specified, operation and measurement of physical properties and the like are performed under conditions of room temperature (a range of 20° C. or higher and 25° C. or lower)/relative humidity of 40% RH or more and 50% RH or less.

<Polishing Composition>

An aspect of the present invention relates to polishing composition containing a cationically modified silica particles, a non-aromatic crosslinked cyclic compound having an organic acid group or a group of a salt thereof, and water. According to an aspect of the present invention, there is provided means capable of improving an effect of inhibiting polishing of silicon nitride.

The present inventors presume a mechanism by which the above problems can be solved as follows.

The non-aromatic crosslinked cyclic compound having an organic acid group or a group of a salt thereof is adsorbed in a silicon nitride film (silicon nitride surface) having a positive charge by an electrostatic attraction force between the organic acid group or the group of the salt thereof which is an anionic functional group and the silicon nitride film. In this case, the non-aromatic crosslinked cyclic compound having an organic acid group or a group of a salt thereof strongly protects the silicon nitride film from abrasive grains by suppressing a collision between the abrasive grains and the silicon nitride film due to a bulky cyclic structure thereof. Therefore, a scraping action of the abrasive grains on the silicon nitride film is weakened.

In addition, since the cationically modified silica particles have a positive charge and the silicon nitride film also has a positive charge, electrostatic repulsion occurs between the cationically modified silica particles and the silicon nitride film, and the scraping action and scraping frequency of the abrasive grains on the silicon nitride film are weakened. Then, the cationically modified silica particles and the non-aromatic crosslinked cyclic compound having an organic acid group or a group of a salt thereof are combined with each other, such that functions of both of them are synergistically improved, and an effect of inhibiting polishing of the silicon nitride film by the abrasive grains is thus remarkably improved.

Note that the above mechanism is based on the presumption, and whether it is right or wrong does not affect the technical scope of the present invention.

Hereinafter, each component can be contained in the polishing composition, an object to be polished, and the like will be described.

(SiN Polishing Inhibitor)

The polishing composition according to an embodiment of the present invention contains a compound that inhibits polishing of silicon nitride (in the present specification, also referred to as a "SiN polishing inhibitor"). The SiN polishing inhibitor is a non-aromatic crosslinked cyclic compound having an organic acid group or a group of a salt thereof. As described above, the SiN polishing inhibitor acts to inhibit polishing of silicon nitride. In addition, when an object to be polished further containing another material (in particular, titanium nitride) in addition to silicon nitride is polished, the SiN polishing inhibitor acts to increase a selection ratio of the another material to silicon nitride due to its effect of inhibiting polishing of silicon nitride.

Note that adsorption of the SiN polishing inhibitor in the silicon nitride film can be confirmed by time-of-flight secondary ion mass spectrometry (TOF-SIMS) analysis.

In the present specification, the non-aromatic crosslinked cyclic compound refers to a crosslinked compound excluding a compound having a structure in which one side is shared (that is, a condensed ring compound) among compounds having no aromatic ring in a molecule and having a structure in which both ends of a linear structure portion of each of two or more substituents which one monocyclic structure has are bonded to each other. The non-aromatic crosslinked cyclic compound is not particularly limited, and examples thereof can include camphor, adamantane, derivatives thereof in which hydrocarbon groups forming a ring in a molecule structure thereof are substituted with other atoms or functional groups, and the like.

The organic acid group or the group of the salt thereof is not particularly limited, and preferred examples thereof can include a carboxyl group, a group of a salt of a carboxyl group, a sulfo group, a group of a salt of a sulfo group, a phosphonic acid group, a group of a salt of a phosphonic acid group, a phosphoric acid group, a group of a salt of a phosphoric acid group, and the like. That is, the non-aromatic crosslinked cyclic compound having an organic acid group or a group of a salt thereof preferably has at least one selected from the group consisting of a carboxyl group, a group of a salt of a carboxyl group, a sulfo group, a group of a salt of a sulfo group, a phosphonic acid group, a group of a salt of a phosphonic acid group, a phosphoric acid group, and a group of a salt of a phosphoric acid group. In addition, among them, the non-aromatic crosslinked cyclic compound having an organic acid group or a group of a salt thereof more preferably has a carboxyl group, a group of a salt of a carboxyl group, a sulfo group, or a group of a salt of a sulfo group, still more preferably has a carboxyl group or a sulfo group, and particularly preferably has a sulfo group. The effect of inhibiting polishing of silicon nitride is further improved by these groups. In addition, when an object to be polished further containing another material (in particular, titanium nitride) in addition to silicon nitride is polished, a selection ratio of the another material to silicon nitride is further increased.

The non-aromatic crosslinked cyclic compound having an organic acid group or a group of a salt thereof is not particularly limited, but is preferably a compound represented by the following general formula 1, from the viewpoint of further improving the effect of inhibiting polishing of silicon nitride and having a high polishing speed of the another material.

[Chem. 1]

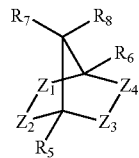

(General formula 1)

In the above general formula 1,
$Z_1$ is $CR_1R_1'$, $C=O$, or $O$,
$Z_2$ is $CR_2R_2'$, $C=O$, or $O$,
$Z_3$ is $CR_3R_3'$, $C=O$, or $O$,
$Z_4$ is $CR_4R_4'$, $C=O$, or $O$,
$R_1$, $R_1'$, $R_2$, $R_2'$, $R_3$, $R_3'$, $R_4$, $R_4'$, $R_5$, $R_6$, $R_7$, and $R_8$ are each independently a hydrogen atom, a deuterium atom, a halogen atom, a substituted or unsubstituted hydrocarbon group (for example, a substituted or unsubstituted alkyl group, a substituted or unsubstituted alkenyl group, or a substituted or unsubstituted alkynyl group), a substituted or unsubstituted alkoxy group, a substituted or unsubstituted polyoxyalkylene group, or an organic acid group or a group of a salt thereof, in a case where at least one of $R_1$, $R_1'$, $R_2$, $R_2'$, $R_3$, $R_3'$, $R_4$, $R_4'$, $R_5$, $R_6$, $R_7$, and $R_8$ is a substituted group, a substituent is each independently a deuterium atom, a halogen atom, an unsubstituted hydrocarbon group (for example, an unsubstituted alkyl group, an unsubstituted alkenyl group, or an unsubstituted alkynyl group), an unsubstituted alkoxy group, an unsubstituted polyoxyalkylene group, or an organic acid group or a group of a salt thereof, and at least one of $R_1$, $R_1'$, $R_2$, $R_2'$, $R_3$, $R_3'$, $R_4$, $R_4'$, $R_5$, $R_6$, $R_7$, and $R_8$ contains an organic acid group or a group of a salt thereof.

In the above general formula 1, at least one of $Z_1$, $Z_2$, $Z_3$, and $Z_4$ is preferably $C=O$, at least one of $Z_1$ and $Z_3$ is more preferably $C=O$, any one of $Z_1$ and $Z_3$ is still more preferably $C=O$, and $Z_3$ is particularly preferably $C=O$. In this case, a group that is not $C=O$ of each of $Z_1$, $Z_2$, $Z_3$, and $Z_4$ is preferably CRR' (hereinafter, R represents $R_1$ to $R_4$ corresponding to $Z_1$ to $Z_4$, respectively, and R' represents $R_1'$ to $R_4'$ corresponding to $Z_1$ to $Z_4$, respectively) or O, and more preferably CRR'.

In $R_1$, $R_1'$, $R_2$, $R_2'$, $R_3$, $R_3'$, $R_4$, $R_4'$, $R_5$, $R_6$, $R_7$, and $R_8$ in the above general formula 1, the halogen atom is not particularly limited, and examples thereof can include F, Cl, Br, I, and the like.

In $R_1$, $R_1'$, $R_2$, $R_2'$, $R_3$, $R_3'$, $R_4$, $R_4'$, $R_5$, $R_6$, $R_7$, and $R_8$ in the above general formula 1, examples of the hydrocarbon group can include an alkyl group, an alkenyl group, and an alkynyl group. Among them, an alkyl group is preferred.

The alkyl group may be linear, branched, or cyclic. The alkyl group is not particularly limited, and an example thereof can include an alkyl group having 1 to 12 carbon atoms. Among them, a linear or branched alkyl group having 1 to 5 carbon atoms is preferred, and specific examples thereof can include a methyl group, an ethyl group, an n-propyl group, an isopropyl group, an n-butyl group, an isobutyl group, a sec-butyl group, a tert-butyl group, an n-pentyl group, an isopentyl group, a neopentyl group, a 2-methylbutyl group, and the like. Among them, a linear alkyl group having 1 to 5 carbon atoms is preferred, a methyl group, an ethyl group, an n-propyl group, or an isopropyl group is more preferred, a methyl group or an ethyl group is still more preferred, and a methyl group is particularly preferred.

The alkenyl group may be linear, branched, or cyclic. The alkenyl group is not particularly limited, and examples thereof can include a vinyl group, a 2-propenyl group, a 2-butenyl group, a 3-butenyl group, a 1-methyl-2-propenyl group, a 2-methyl-2-propenyl group, a 2-pentenyl group, a 3-pentenyl group, a 4-pentenyl group, a 1-methyl-2-butenyl group, a 2-methyl-2-butenyl group, a 3-methyl-2-butenyl group, a 1-methyl-3-butenyl group, a 2-methyl-3-butenyl group, a 3-methyl-3-butenyl group, a 1,1-dimethyl-2-propenyl group, a 1,2-dimethyl-2-propenyl group, a 1-ethyl-2-propenyl group, and the like.

The alkynyl group may be linear, branched, or cyclic. The alkynyl group is not particularly limited, and examples thereof can include a 2-butynyl group, a 3-pentynyl group, a hexynyl group, a heptynyl group, an octynyl group, a decynyl group, and the like.

In $R_1$, $R_1'$, $R_2$, $R_2'$, $R_3$, $R_3'$, $R_4$, $R_4'$, $R_5$, $R_6$, $R_7$, and $R_8$ in the above general formula 1, the alkoxy group is not particularly limited, and examples thereof can include a methoxy group, an ethoxy group, an n-propoxy group, an isopropoxy group, an n-butoxy group, an isobutoxy group, a sec-butoxy group, a tert-butoxy group, an n-pentoxy group, an isopentoxy group, a neopentoxy group, a t-pentoxy group, a 2-methylbutoxy group, and the like.

In $R_1$, $R_1'$, $R_2$, $R_2'$, $R_3$, $R_3'$, $R_4$, $R_4'$, $R_5$, $R_6$, $R_7$, and $R_8$ in the above general formula 1, the polyoxyalkylene group is not particularly limited, and examples thereof can include a polyoxyethylene group, a polyoxypropylene group, a polyoxybutylene group, a block polyoxyalkylene group of a polyoxyethylene group and a polyoxypropylene group, a random polyoxyalkylene group of a polyoxyethylene group and a polyoxypropylene group, a block polyoxyalkylene group of a polyoxyethylene group and a polyoxybutylene group, a random polyoxyalkylene group of a polyoxyethylene group and a polyoxybutylene group, and the like.

In $R_1$, $R_1'$, $R_2$, $R_2'$, $R_3$, $R_3'$, $R_4$, $R_4'$, $R_5$, $R_6$, $R_7$, and $R_8$ in the above general formula 1, the organic acid group or the group of the salt thereof is not particularly limited, but at least one selected from the group consisting of a carboxyl group, a group of a salt of a carboxyl group, a sulfo group, a group of a salt of a sulfo group, a phosphonic acid group, a group of a salt of a phosphonic acid group, a phosphoric acid group, and a group of a salt of a phosphoric acid group is preferred, as described above. Among them, a carboxyl group, a group of a salt of a carboxyl group, a sulfo group, or a group of a salt of a sulfo group is more preferred, a carboxyl group or a sulfo group is still more preferred, and a sulfo group is particularly preferred.

In the above general formula 1, in a case where at least one of $R_1$, $R_1'$, $R_2$, $R_2'$, $R_3$, $R_3'$, $R_4$, $R_4'$, $R_5$, $R_6$, $R_7$, and $R_8$ is a substituted group, a halogen atom, a hydrocarbon group (for example, an alkyl group, an alkenyl group, or an alkynyl group), an alkoxy group, a polyoxyalkylene group, or an organic acid group or a group of a salt thereof as a substituent is the same as that described for the groups in $R_1$, $R_1'$, $R_2$, $R_2'$, $R_3$, $R_3'$, $R_4$, $R_4'$, $R_5$, $R_6$, $R_7$, and $R_8$ in the above general formula 1.

In the above general formula 1, in a case where at least one of $R_1$, $R_1'$, $R_2$, $R_2'$, $R_3$, $R_3'$, $R_4$, $R_4'$, $R_5$, $R_6$, $R_7$, and $R_8$ is a substituted hydrocarbon group (for example, a substituted alkyl group, a substituted alkenyl group, or a substituted alkynyl group), a substituent is each independently preferably a deuterium atom, a halogen atom, an unsubstituted alkoxy group, an unsubstituted polyoxyalkylene group, or an organic acid group or a group of a salt thereof. In addition, in the above general formula 1, in a case where at least one of $R_1$, $R_1'$, $R_2$, $R_2'$, $R_3$, $R_3'$, $R_4$, $R_4'$, $R_5$, $R_6$, $R_7$, and $R_8$ is a substituted alkoxy group or a substituted polyoxyalkylene group, a substituent is each independently preferably a deuterium atom, a halogen atom, an unsubstituted alkenyl group, an unsubstituted alkynyl group, an unsubstituted alkoxy group, an unsubstituted polyoxyalkylene group, or an organic acid group or a group of a salt thereof.

In the above general formula 1, at least one of $R_1$, $R_1'$, $R_2$, $R_2'$, $R_3$, $R_3'$, $R_4$, $R_4'$, $R_5$, $R_6$, $R_7$, and $R_8$ is preferably an organic acid group or a group of a salt thereof, or an alkyl group substituted with an organic acid group or a group of a salt thereof. Among them, only one of $R_1$, $R_1'$, $R_2$, $R_2'$, $R_3$, $R_3'$, $R_4$, $R^{4'}$, $R_5$, $R_6$, $R_7$, and $R_8$ is more preferably an organic acid group or a group of a salt thereof, or an alkyl group substituted with an organic acid group or a group of a salt thereof. In this case, the organic acid group or the group of the salt thereof, or the alkyl group substituted with an organic acid group or a group of a salt thereof is more preferably a carboxyl group or a group of a salt thereof, a sulfo group or a group of a salt thereof, a methyl group substituted with a carboxyl group or a group of a salt thereof, or a methyl group substituted with a sulfo group or a group of a salt thereof, particularly preferably a carboxyl group or a methyl group substituted with a sulfo group, and most preferably a methyl group substituted with a sulfo group. The effect of inhibiting polishing of silicon nitride is further improved by these groups. In addition, when an object to be polished further containing another material (in particular, titanium nitride) in addition to silicon nitride is polished, a selection ratio of the another material to silicon nitride is further increased.

It is particularly preferable that in the above general formula 1, $R_1$, $R_1'$, $R_2$, $R_2'$, $R_3$, $R_3'$, $R_4$, and $R_4'$ are each independently a hydrogen atom.

In the above general formula 1, $R_5$ is preferably a hydrogen atom or a substituted or unsubstituted alkyl group, more preferably a substituted or unsubstituted alkyl group, still more preferably a substituted alkyl group, and particularly preferably an alkyl group substituted with an organic acid group or a group of a salt thereof. In this case, as the alkyl group substituted with an organic acid group or a group of a salt thereof, a methyl group substituted with a sulfo group or a group of a salt thereof is preferred, and a methyl group substituted with a sulfo group is particularly preferred.

In the above general formula 1, $R_6$ is preferably a hydrogen atom or an organic acid group or a group of a salt thereof, more preferably a hydrogen atom or a carboxyl group or a group of a salt thereof, still more preferably a hydrogen atom or a carboxyl group, and particularly preferably a hydrogen atom.

In the above general formula 1, $R_7$ and $R_8$ are each independently preferably a substituted or unsubstituted alkyl group, more preferably an unsubstituted alkyl group, and particularly preferably a methyl group.

Preferred specific examples of the SiN polishing inhibitor can include (+)-10-camphorsulfonic acid, camphanic acid, ketopinic acid, and the like. Among them, (+)-10-camphorsulfonic acid or camphanic acid is preferred, and (+)-10-camphorsulfonic acid is more preferred.

Note that the SiN polishing inhibitors can be used alone or in combination of two or more. In addition, a synthesized product or a commercially available product may be used as the SiN polishing inhibitor.

An addition amount (concentration) of the SiN polishing inhibitor is not particularly limited, but is preferably 0.001% by mass or more, more preferably 0.01% by mass or more, still more preferably 0.05% by mass or more, and particularly preferably 0.15% by mass or more, with respect to a total mass of the polishing composition. Within this range, the effect of inhibiting polishing of silicon nitride is further improved. In addition, when an object to be polished further containing another material (in particular, titanium nitride) in addition to silicon nitride is polished, a selection ratio of the another material to silicon nitride is further increased. In addition, the addition amount (concentration) of the SiN polishing inhibitor is not particularly limited, but is preferably 10% by mass or less, more preferably 5% by mass or less, still more preferably 1% by mass or less, and particularly preferably 0.5% by mass or less, with respect to the total mass of the polishing composition. Within this range, the effect of the SiN polishing inhibitor is further improved. The reason is presumed that the electrostatic repulsion between the abrasive grains and silicon nitride is more preferably maintained because the electrical conductivity is not excessively high and an electric double layer between the abrasive grains and silicon nitride is not excessively compressed. In addition, within this range, dispersion stability of a slurry is also more preferably ensured.

Alternatively, the addition amount (concentration) of the SiN polishing inhibitor is not particularly limited, but may be appropriately selected so as to have a desired pH value of the polishing composition. In this case, the SiN polishing inhibitor is preferably added so as to have a preferred pH value of the polishing composition described below. Note that, it is not particularly limited, but the case where such an addition amount (concentration) is adopted is particularly preferably adopted when a pH adjusting agent described below is not simultaneously used.

(Abrasive Grains)

The polishing composition according to an embodiment of the present invention contains a cationically modified silica abrasive. That is, the polishing composition according to an embodiment of the present invention contains cationically modified silica particles as abrasive grains. Thus, the polishing composition according to an embodiment of the present invention contains at least one type of cationically modified silica particles. The abrasive grains are generally used for mechanically polishing an object to be polished, and act to increase a polishing speed, and in the case of the cationically modified silica particles, as described above, the polishing of silicon nitride is inhibited. In addition, when an object to be polished further containing another material (in particular, titanium nitride) in addition to silicon nitride is polished, the cationically modified silica particles as abrasive grains act to increase a polishing speed of the another material and thus to increase a selection ratio of the another material to silicon nitride.

A type of silica particles to be a raw material of the cationically modified silica particles is not particularly limited. Examples thereof can include fumed silica, colloidal silica, and the like, and colloidal silica is preferred. Examples of a production method of colloidal silica can include a sodium silicate method and a sol-gel method. Any colloidal silica produced by any production method is preferably used. However, colloidal silica produced by a sol-gel method is preferred, from the viewpoint of reducing metal impurities. This is because colloidal silica produced by a sol-gel method has a small content of metal impurities having a property of being diffused in a semiconductor or corrosive ions such as chloride ions and the like. The production of the colloidal silica by the sol-gel method can be performed using a method known in the related art. Specifically, colloidal silica can be obtained by using a hydrolysable silicon compound (for example, alkoxysilane or a derivative thereof) as a raw material and performing a hydrolysis and condensation reaction.

known cationically modified silica particles can be appropriately selected and used. In addition, the cationically modified silica particles can be produced by a method appropriately selected from the known production methods, and the cationically modified silica particles can be used.

As the cationically modified silica particles (that is, as the type of cationically modified silica particles), cationically modified colloidal silica is preferred. A preferred example of colloidal silica having a cationic group (cationically modified colloidal silica) can include colloidal silica having an amino group immobilized on a surface thereof. An example of the production method of colloidal silica having a cationic group can include a method of immobilizing, on a surface of a silica particles, a silane coupling agent having an amino group such as aminoethyltrimethoxysilane, aminopropyltrimethoxysilane, aminoethyltriethoxysilane, aminopropyltriethoxysilane, aminopropyldimethylethoxysilane, aminopropylmethyldiethoxysilane, aminobutyltriethoxysilane, or the like, as described in JP 2005-162533 A. Therefore, colloidal silica having an amino group immobilized on a surface thereof (amino group-modified colloidal silica) can be obtained. The effect of inhibiting polishing of silicon nitride is further improved by the cationically modified colloidal silica. In addition, when an object to be polished further containing another material (in particular, titanium nitride) in addition to silicon nitride is polished, a selection ratio of the another material to silicon nitride is further increased.

A shape of the cationically modified silica particle is not particularly limited, but may be a spherical shape or a non-spherical shape. Specific examples of the non-spherical shape can include various shapes such as a polygonal prism shape such as a triangular prism, a tetragonal prism, or the like, a cylindrical shape, a straw bag shape in which a central portion of a cylinder is inflated compared to ends, a doughnut shape in which a central portion of a disk is perforated, a plate shape, a so-called cocoon-like shape having a constriction in a middle portion, a so-called associated type spherical shape in which a plurality of particles are integrated, a so-called konpeito shape having a plurality of protrusions on a surface, a rugby ball shape, and the like, but are not limited thereto.

Among them, in a case where an object to be polished further containing silicon oxide as another material is polished, a cocoon-like shape is preferred, from the viewpoint of suppressing a polishing speed of silicon oxide.

An average primary particle size of the cationically modified silica particles is not particularly limited, but is preferably 5 nm or more, more preferably 7 nm or more, still more preferably 10 nm or more, and particularly preferably 25 nm or more. Within this range, when an object to be polished further containing another material (in particular, titanium nitride) in addition to silicon nitride is polished, a selection ratio of the another material to silicon nitride is further increased. In addition, the average primary particle size of the cationically modified silica particles is not particularly limited, but is preferably 120 nm or less, more preferably 80 nm or less, and still more preferably 50 nm or less. Within this range, the effect of inhibiting polishing of silicon nitride is further improved. Note that a value of the average primary particle size of the cationically modified silica particles can be calculated based on a specific surface area of the cationically modified silica particles measured by a BET method (BET specific surface area), assuming that the shape of the cationically modified silica particle is a spherical shape.

More specifically, the average primary particle size of the cationically modified silica particles can be calculated from a specific surface area of the cationically modified silica particles measured by a BET method using a "Flow Sorb II 2300" (manufactured by Micromeritics Instrument Corporation) and a density of the cationically modified silica particle.

An average secondary particle size of the cationically modified silica particles is not particularly limited, but is preferably 10 nm or more, more preferably 20 nm or more, still more preferably 30 nm or more, and particularly preferably 50 nm or more. Within this range, when an object to be polished further containing another material (in particular, titanium nitride) in addition to silicon nitride is polished, a selection ratio of the another material to silicon nitride is further increased. In addition, the average secondary particle size of the cationically modified silica particles is not particularly limited, but is preferably 250 nm or less, more preferably 200 nm or less, still more preferably 150 nm or less, and particularly preferably 100 nm or less. Within this range, the effect of inhibiting polishing of silicon nitride is further improved. Note that a value of the average secondary particle size of the cationically modified silica particles can be calculated by, for example, a dynamic light scattering method represented by a laser diffraction scattering method, using a dynamic light scattering particle size and particle size distribution apparatus (UPA-UTI151, manufactured by Nikkiso Co., Ltd.).

In addition, a degree of association of the cationically modified silica particles is not particularly limited, but is preferably 5 or less, more preferably 3 or less, and still more preferably 2.5 or less. Within this range, the effect of inhibiting polishing of silicon nitride is further improved. In addition, the degree of association of the cationically modified silica particles is preferably 1 or more, and more preferably 1.2 or more. Within this range, when an object to be polished further containing another material (in particular, titanium nitride) in addition to silicon nitride is polished, a selection ratio of the another material to silicon nitride is further increased. Note that the degree of association of the cationically modified silica particles is obtained by dividing the value of the average secondary particle size of the cationically modified silica particles by the value of the average primary particle size.

The number of silanol group per unit surface area of the cationically modified silica particles (hereinafter, also referred to as "a density of a silanol group") is not particularly limited, but preferably exceeds 0/nm$^2$, more preferably 0.2/nm$^2$ or more, still more preferably 1/nm$^2$ or more, and particularly preferably 1.4/nm$^2$ or more. Within this range, dispersibility of the abrasive grains is improved, and when an object to be polished further containing another material (in particular, titanium nitride) in addition to silicon nitride is polished, a selection ratio of the another material to silicon nitride is further increased. In addition, the density of the silanol group in the cationically modified silica particles is preferably 10/nm$^2$ or less, more preferably 6/nm$^2$ or less, still more preferably 4/nm$^2$ or less, and particularly preferably 2/nm$^2$ or less. The density of the silanol group in the cationically modified silica particles can be calculated by measuring or calculating each parameter by the following measurement method or a calculation method, respectively, and then performing calculation by the following method.

C in the following equation is a total mass of the cationically modified silica particles, and S in the following equation is a BET specific surface area of the cationically modified silica particles. First, 1.50 g of the cationically modified silica particles as a solid content are collected in a 200 ml beaker, 100 ml of pure water is added to obtain a slurry, and then 30 g of sodium chloride is added and dissolved. Next, 1 N hydrochloric acid is added to adjust a pH of the slurry to about 3.0 to 3.5, and then pure water is added until the amount of the slurry becomes 150 ml. The pH of the slurry is adjusted to 4.0 by using 0.1 N sodium hydroxide at 25° C. using an automatic titration apparatus (manufactured by Hiranuma Sangyo Co., Ltd., COM-1700), and a volume V [L] of a 0.1 N sodium hydroxide solution required for increasing the pH from 4.0 to 9.0 by pH titration is measured. The density of the silanol group can be calculated by the following equation.

$$\rho = (c \times V \times N_A \times 10^{-21})/(C \times S) \qquad [\text{Math. 1}]$$

In the equation,
$\rho$ represents the density (number/nm$^2$) of the silanol group;
c represents a concentration (mol/L) of the sodium hydroxide solution used in the titration;
V represents a volume (L) of the sodium hydroxide solution required for increasing the pH from 4.0 to 9.0;
$N_A$ represents the Avogadro constant (number/mol);
C represents the total mass (solid content) (g) of the cationically modified silica particles; and
S represents a weighted average (nm$^2$/g) of the BET specific surface areas of the cationically modified silica particles.

Note that the BET specific surface area of the cationically modified silica particles can be measured using a "Flow Sorb II 2300" (manufactured by Micromeritics Instrument Corporation).

A zeta potential of the cationically modified silica particles in the polishing composition is not particularly limited, but is preferably a positive value. Within this range, the effect of inhibiting polishing of silicon nitride is further improved. In addition, when an object to be polished further containing another material (in particular, titanium nitride) in addition to silicon nitride is polished, a selection ratio of the another material to silicon nitride is further increased. The reason is presumed that the positive charge of the cationically modified silica particles become stronger, the electrostatic repulsion between the cationically modified silica particles and the silicon nitride film becomes stronger, and the scraping action and the scraping frequency of the abrasive grains on the silicon nitride film are weakened. From the similar viewpoint, the zeta potential of the cationically modified silica particles in the polishing composition is generally a positive value, and the larger the value is, the more preferable it is. Therefore, the zeta potential is more preferably 10 mV or more, still more preferably 20 mV or more, and particularly preferably 30 mV or more, for example. In addition, the zeta potential of the cationically modified silica particles in the polishing composition is preferably, for example, 60 mV or less. The zeta potential of the cationically modified silica particles in the polishing composition can be calculated by supplying the polishing composition to ELS-Z2 (manufactured by Otsuka Electronics Co., Ltd.), performing measurement using a flow cell at a measurement temperature of 25° C. by a laser Doppler method (electrophoretic light scattering measurement method), and analyzing the obtained data by the Smoluchowski equation.

The sizes (average primary particle size and average secondary particle size) and the degree of association of the cationically modified silica particles, the density of the silanol group, and the zeta potential in the polishing composition can be appropriately controlled by a selection of a production method of the cationically modified silica particles and the like. In particular, the density of the silanol group is preferably controlled, for example, under a condition of a heat treatment such as firing or the like.

Note that the cationically modified silica particles can be used alone or in combination of two or more.

An addition amount (concentration) of the cationically modified silica particles is not particularly limited, but is preferably 0.001% by mass or more, more preferably 0.01% by mass or more, and still more preferably 0.1% by mass or more, with respect to the total mass of the polishing composition. Within this range, when an object to be polished further containing another material (in particular, titanium nitride) in addition to silicon nitride is polished, a selection ratio of the another material to silicon nitride is further increased. In addition, the addition amount (concentration) of the cationically modified silica particles is not particularly limited, but is preferably 30% by mass or less, more preferably 10% by mass or less, and still more preferably 5% by mass or less, with respect to the total mass of the polishing composition. Within this range, the effect of inhibiting polishing of silicon nitride is further improved.

The polishing composition according to an embodiment of the present invention may further contain other abrasive grains in addition to the cationically modified silica particles. The other abrasive grains may be any of inorganic particles other than the cationically modified silica particles, organic particles, and organic-inorganic composite particles. Examples of the inorganic particles other than the cationically modified silica particles can include surface-unmodified silica particles, anion-modified silica particles, particles including a metal oxide such as alumina particles, ceria particles, titania particles, or the like, silicon nitride particles, silicon carbide particles, and boron nitride particles. A specific example of the organic particles can include polymethylmethacrylate (PMMA) particles.

However, in the polishing composition according to an embodiment of the present invention, it is preferable that an addition amount (concentration) of the other abrasive grains is as small as possible, and it is particularly preferable that the other abrasive grains are not substantially contained. Note that in the present specification, "the other abrasive grains are not substantially contained" means a case where the addition amount (concentration) of the other abrasive grains is less than 0.001% by mass with respect to the total mass of the polishing composition.

(Silicon Oxide Polishing Inhibitor)

The polishing composition according to an embodiment of the present invention preferably further contains a compound that inhibits polishing of silicon oxide (in the present specification, also referred to as a "silicon oxide polishing inhibitor"). The silicon oxide polishing inhibitor is a compound represented by the following general formula 2.

[Chem. 2]

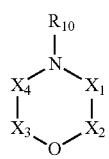

(General formula 2)

In the above general formula 2,
$X_1$ is $CR_{11}R_{11}'$ or $C=O$,
$X_2$ is $CR_{12}R_{12}'$ or $C=O$,
$X_3$ is $CR_{13}R_{13}'$ or $C=O$,
$X_4$ is $CR_{14}R_{14}'$ or $C=O$, and
$R_{10}$, $R_{11}$, $R_{11}'$, $R_{12}$, $R_{12}'$, $R_{13}$, $R_{13}'$, $R_{14}$, and $R_{14}'$ are each independently a hydrogen atom, a deuterium atom, a halogen atom, a substituted or unsubstituted hydrocarbon group, a substituted or unsubstituted oxyhydrocarbon group, a substituted or unsubstituted polyoxyalkylene group, or a group represented by the following general formula 3.

[Chem. 3]

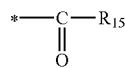

(General formula 3)

In the above general formula 3,
$R_{15}$ is a hydrogen atom, a deuterium atom, a halogen atom, or a substituted or unsubstituted hydrocarbon group,
* is a bond bonded to a ring-constituting nitrogen atom (N) of the above general formula 2, and in a case where at least one of $R_{10}$, $R_{11}$, $R_{11}'$, $R_{12}$, $R_{12}'$, $R_{13}$, $R_{13}'$, $R_{14}$, $R_{14}'$, and $R_{15}$ is a substituted group, a substituent is each independently a deuterium atom, a halogen atom, an unsubstituted oxyhydrocarbon group, or an unsubstituted polyoxyalkylene group.

The silicon oxide polishing inhibitor acts to inhibit polishing of silicon oxide which is another material. In addition, when an object to be polished further containing another material other than silicon oxide (in particular, titanium nitride) in addition to silicon oxide is polished, the silicon oxide polishing inhibitor acts to increase a selection ratio of the another material other than silicon oxide to silicon oxide. A detailed reason is not clear, but it is presumed as follows. It is confirmed that the silicon oxide polishing inhibitor is adsorbed in a $SiO_2$ sensor by a quartz crystal microbalance (QCM). Due to this, the silicon oxide polishing inhibitor is adsorbed in a silicon oxide film (silicon oxide surface) and a collision between the abrasive grains and the silicon oxide film is suppressed, such that the silicon oxide film is protected from the abrasive grains. Note that the above mechanism is based on the presumption, and whether it is right or wrong does not affect the technical scope of the present invention.

In a preferred embodiment of the present invention, the polishing composition further contains the silicon oxide polishing inhibitor, in addition to the cationically modified silica particles and the SiN polishing inhibitor. The SiN polishing inhibitor acts on silicon nitride, the silicon oxide polishing inhibitor acts on silicon oxide, and each of the actions is preferably exhibited, such that both the effect of increasing the selection ratio of the another material to silicon nitride and the effect of increasing the selection ratio of the another material other than silicon oxide to silicon oxide are implemented by the polishing composition.

In $R_{10}$, $R_{11}$, $R_{11}'$, $R_{12}$, $R_{12}'$, $R_{13}$, $R_{13}'$, $R_{14}$, and $R_{14}'$ in the above general formula 2 and $R_{15}$ in the above general formula 3, the halogen atom is not particularly limited, and examples thereof can include F, Cl, Br, I, and the like.

In $R_{10}$, $R_{11}$, $R_{11}'$, $R_{12}$, $R_{12}'$, $R_{13}$, $R_{13}'$, $R_{14}$, and $R_{14}'$ in the above general formula 2 and $R_{15}$ in the above general formula 3, the hydrocarbon group is not particularly limited, and examples thereof can include an alkyl group, an alkenyl group, an alkynyl group, and the like. The alkyl group, the alkenyl group, or the alkynyl group is not particularly limited, and examples thereof are the same as that described for the groups in $R_1$, $R_1'$, $R_2$, $R_2'$, $R_3$, $R_3'$, $R_4$, $R_4'$, $R_5$, $R_6$, $R_7$, and $R_8$ in the above general formula 1.

In $R_{10}$, $R_{11}$, $R_{11}'$, $R_{12}$, $R_{12}'$, $R_{13}$, $R_{13}'$, $R_{14}$, and $R_{14}'$ in the above general formula 2, the oxyhydrocarbon group represents a group represented by "—OR"", and R" represents a hydrocarbon group. Note that the hydrocarbon group is the same as that described for $R_{10}$, $R_{11}$, $R_{11}'$, $R_{12}$, $R_{12}'$, $R_{13}$, $R_{13}'$, $R_{14}$, and $R_{14}'$ in the above general formula 2 and $R_{15}$ in the above general formula 3.

The polyoxyalkylene group in $R_{10}$, $R_{11}$, $R_{11}'$, $R_{12}$, $R_{12}'$, $R_{13}$, $R_{13}'$, $R_{14}$, and $R_{14}'$ in the above general formula 2 is not particularly limited, and examples thereof are the same as that described for the polyoxyalkylene group in $R_1$, $R_1'$, $R_2$, $R_2'$, $R_3$, RY, $R_4$, $R_4'$, $R_5$, $R_6$, $R_7$, and $R_8$ in the above general formula 1.

In a case where at least one of $R_{10}$, $R_{11}$, $R_{11}'$, $R_{12}$, $R_{12}'$, $R_{13}$, $R_{13}'$, $R_{14}$, and $R_{14}'$ in the above general formula 2 is a substituted group, or in a case where $R_{15}$ in the above general formula 3 is a substituted group, a halogen atom as a substituent is not particularly limited, and examples thereof can include F, Cl, Br, I, and the like. In addition, each of the oxyhydrocarbon group and the polyoxyalkylene group as a substituent is the same as that described for the groups in $R_{10}$, $R_{11}$, $R_{11}'$, $R_{12}$, $R_{12}'$, $R_{13}$, $R_{13}'$, $R_{14}$, and $R_{14}'$ in the above general formula 2.

In the above general formula 2, $R_{10}$ is preferably the group represented by the above general formula 3. In this case, $R_{15}$ is preferably a substituted or unsubstituted hydrocarbon group, more preferably an unsubstituted hydrocarbon group, still more preferably an unsubstituted alkyl group or an unsubstituted alkenyl group, further still more preferably an unsubstituted alkyl group having 1 to 6 carbon atoms or an unsubstituted alkenyl group having 2 to 6 carbon atoms, and particularly preferably a methyl group or a vinyl group.

In the above general formula 2, all of $R_{11}$, $R_{11}'$, $R_{12}$, $R_{12}'$, $R_{13}$, $R_{13}'$, $R_{14}$, and $R_{14}'$ are preferably a hydrogen atom.

The silicon oxide polishing inhibitor is not particularly limited, and specific examples thereof can include 4-acetylmorpholine, 3-morpholinone, N-methyl-2-morpholinone, 4-vinyl-3-morpholinone, 4-acryloylmorpholine, 4-methacryloyl morpholine, and the like. Among them, 4-acetylmorpholine or 4-acryloylmorpholine is preferred. From the viewpoint of the effect of increasing the selection ratio of another material to silicon nitride, 4-acetylmorpholine is more preferred, and from the viewpoint of the effect of increasing the selection ratio of another material to silicon oxide, 4-acryloylmorpholine is more preferred.

The silicon oxide polishing inhibitors can be used alone or in combination of two or more. In addition, a synthesized product or a commercially available product may be used as the silicon oxide polishing inhibitor.

An addition amount (concentration) of the silicon oxide polishing inhibitor is not particularly limited, but is preferably 0.001% by mass or more, more preferably 0.01% by mass or more, still more preferably 0.1% by mass or more, and particularly preferably 0.25% by mass or more, with respect to the total mass of the polishing composition. Within this range, the effect of inhibiting polishing of silicon oxide is further improved. In addition, when an object to be polished further containing another material other than silicon oxide (in particular, titanium nitride) in addition to silicon oxide is polished, the selection ratio of the another material other than silicon oxide to silicon oxide is further increased. In addition, the addition amount (concentration) of the silicon oxide polishing inhibitor is not particularly limited, but is preferably 10% by mass or less, more preferably 5% by mass or less, still more preferably 1% by mass or less, and particularly preferably 0.5% by mass or less, with respect to the total mass of the polishing composition. Within this range, the effect of the silicon oxide polishing inhibitor is further improved. The reason is presumed that the electrostatic repulsion between the abrasive grains and silicon oxide is more preferably maintained because the electrical conductivity is not excessively high and the electric double layer between the abrasive grain and silicon oxide is not excessively compressed. In addition, within this range, dispersion stability of a slurry is also more preferably ensured.

(Oxidizing Agent)

The polishing composition according to an embodiment of the present invention preferably further contains an oxidizing agent. The oxidizing agent oxides a film surface of the material other than the silicon nitride film, and thus acts to improve a polishing characteristic such as an increase in polishing speed of the other material, an improvement of surface quality of an object to be polished after polishing, or the like.

The oxidizing agent is not particularly limited, and examples thereof can include hydrogen peroxide, sodium peroxide, barium peroxide, ozone water, a silver (II) salt, an iron (III) salt, permanganic acid, chromic acid, dichromatic acid, peroxodisulfuric acid, peroxophosphoric acid, peroxosulfuric acid, peroxoboric acid, performic acid, peracetic acid, perbenzoic acid, perphthalic acid, hypochlorous acid, hypobromous acid, hypoiodous acid, chloric acid, chlorous acid, perchloric acid, bromic acid, iodic acid, periodic acid, persulfuric acid, dichloroisocyanuric acid, and salts thereof, and the like. Among them, hydrogen peroxide is preferred, from the viewpoint of handleability and safety. Note that the oxidizing agents can be used alone or in combination of two or more.

An addition amount (concentration) of the oxidizing agent is not particularly limited, but is preferably 0.001% by mass or more, more preferably 0.01% by mass or more, and still more preferably 0.1% by mass or more, with respect to the total mass of the polishing composition. Within this range, an oxidation reaction of the material other than the silicon nitride film is more sufficiently carried out, and the selection ratio of the other material to silicon nitride is thus further increased. In addition, an addition amount (concentration) of the oxidizing agent is not particularly limited, but is preferably 10% by mass or less, more preferably 5% by mass or less, and still more preferably 3% by mass or less, with respect to the total mass of the polishing composition. Within this range, it is possible to reduce the influence of a decrease in concentration of the abrasive grains due to addition of the oxidizing agent and to more preferably maintain the polishing speed of the material other than the silicon nitride film, such that the selection ratio of the other material to silicon nitride is further increased.

(pH Adjusting Agent)

The polishing composition according to an embodiment of the present invention preferably further contains a pH adjusting agent. The pH adjusting agent adjusts a pH of the polishing composition to a preferred range so as to improve the chemical polishing effect on a surface to be polished, thereby acting to increase the polishing speed or to improve dispersibility stability of the polishing composition.

Note that in the present specification, the SiN polishing inhibitor is not contained in the pH adjusting agent.

The pH adjusting agent is not particularly limited as long as it is a compound having a pH adjustment function, and examples thereof can include an acid and a basic compound. Here, the basic compound refers to a compound having a function of being dissolved in water to increase a pH of water. The basic compound is added to the polishing composition to act to increase a pH of the polishing composition.

As the acid, either an inorganic acid or an organic acid may be used. The inorganic acid is not particularly limited, and examples thereof can include sulfuric acid, nitric acid, boric acid, carbonic acid, hypophosphorous acid, phosphorous acid, phosphoric acid, and the like. The organic acid is not particularly limited, and examples thereof can include carboxylic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid, and the like.

The basic compound is not particularly limited, and examples thereof can include hydroxide of an alkali metal or a group II element, ammonia, and the like. Specific examples of the hydroxide of an alkali metal can include potassium hydroxide (KOH), sodium hydroxide (NaOH), and the like. Specific examples of the hydroxide of a group II element can include calcium hydroxide ($Ca(OH)_2$) and the like.

Among them, an inorganic acid or a basic compound is preferred, from the viewpoint of adjusting the pH of the polishing compound to a range of an optimal pH value described below. In addition, as the inorganic acid, nitric acid is more preferred. As the basic compound, hydroxide of an alkali metal or a group II element is more preferred, and hydroxide of an alkali metal is still more preferred. As the pH adjusting agent, nitric acid or potassium hydroxide is particularly preferred, and potassium hydroxide is extremely preferred.

Note that the pH adjusting agents can be used alone or in combination of two or more.

An addition amount (concentration) of the pH adjusting agent may be appropriately selected so as to have a desired pH value of the polishing composition, and the pH adjusting agent is preferably added so as to have a preferred pH value of the polishing composition described below.

(pH)

The pH of the polishing composition according to an embodiment of the present invention is not particularly limited. However, a lower limit of the pH is preferably 1 or more, more preferably 1.5 or more, and still more preferably 2 or more. Within this range, the effect of inhibiting polishing of silicon nitride is further improved. The reason is presumed as follows. Within this range, the electrical conductivity is not excessively high, and the electric double layer between the abrasive grain and silicon nitride is not excessively compressed. Therefore, the electrostatic repulsion between the abrasive grains and silicon nitride is more preferably maintained. In addition, deterioration of a polishing apparatus or a consumable member such as a polishing pad or the like to be contacted is less likely to occur. In addition, an upper limit of the pH is preferably 12 or less. Within this range, corrosion is less likely to occur, and the polishing composition can thus be applied to an object to be polished containing various materials. In addition, safety is further improved and handling is more facilitated. The upper limit of the pH is preferably less than 7, more preferably 5 or less, still more preferably 4 or less, particularly preferably less than 4, further particularly preferably 3.5 or less, and extremely preferably 3 or less. Within this range, the effect of inhibiting polishing of silicon nitride is further improved. The reason is presumed as follows. When the pH is within the above range, a surface potential of silicon nitride becomes positive, and a positive value becomes large. In addition, a zeta potential of the abrasive grain also becomes positive, and a positive value also becomes large. Therefore, the electrostatic repulsion between the abrasive grains and silicon nitride becomes stronger, and the scraping action of the abrasive grain is more weakened. Note that the pH value of the polishing composition can be evaluated by a pH meter (trade name: LAQUA (registered trademark), manufactured by Horiba, Ltd.).

(Electrical Conductivity Adjusting Agent)

The polishing composition according to an embodiment of the present invention may further contain an electrical conductivity adjusting agent. The electrical conductivity adjusting agent adjusts an electrical conductivity of the polishing composition to a preferred range so as to act to improve an effect of suppressing the polishing speed of silicon nitride, or to improve the dispersibility stability of the polishing composition.

The electrical conductivity adjusting agent is not particularly limited as long as it is a compound having an electrical conductivity adjusting function, and for example, a salt compound can be used.

Examples of the salt compound can include a salt of an acid, a salt of a basic compound, and the like. The salt of the acid may be an organic acid salt and an inorganic acid salt. The inorganic acid salt is not particularly limited, and examples thereof can include nitrate such as potassium nitrate, ammonium nitrate, or the like, phosphate such as diammonium hydrogen phosphate, ammonium dihydrogen phosphate, or the like, and sulfate such as ammonium sulfate or the like. In addition, the salt of the basic compound is not particularly limited, and examples thereof can include potassium chloride, sodium chloride, potassium bromide, potassium iodide, ammonium citrate, and the like. The salt compounds may be used alone or in combination of two or more.

An addition amount (concentration) of the electrical conductivity adjusting agent may be appropriately selected so as to have a desired electrical conductivity of the polishing composition, and the electrical conductivity adjusting agent is preferably added so as to have a preferred electrical conductivity of the polishing composition described below.

(Electrical Conductivity)

An electrical conductivity (EC) of the polishing composition according to an embodiment of the present invention is not particularly limited. However, a lower limit of the electrical conductivity is preferably 30 µS/cm or more, more preferably 0.1 mS/cm or more, and still more preferably 0.6 mS/cm or more. Within this range, the effect of inhibiting polishing of silicon nitride is further improved. The reason is presumed that, at a low electrical conductivity, an electrostatic repulsive force acting between the abrasive grains and silicon nitride is maintained at a higher state. In addition, an upper limit of the electrical conductivity is preferably less than 10 mS/cm. Within this range, the dispersion stability of the polishing composition is further improved. Furthermore, the upper limit of the electrical conductivity is more preferably 2 mS/cm or less, and still more preferably 1 mS/cm or less. Within this range, the effect of suppressing the polishing speed of the silicon nitride film is further improved. The reason is presumed that the electrical conductivity is excessively increased, and the electrostatic repulsion between the abrasive grains and the silicon nitride film is not weakened. From these viewpoints, an example of a preferred range of the electrical conductivity can include a range of 30 μS/cm or more and 2 mS/cm or less. Note that the electrical conductivity of the polishing composition can be evaluated by a desktop electrical conductivity meter (manufactured by Horiba, Ltd., model: DS-71).

Note that the electrical conductivity can be increased, for example, by increasing an addition amount of an acid, a basic compound, or a salt compound thereof. Specifically, the electrical conductivity may be controlled by adjusting an addition amount of each component other than the electrical conductivity adjusting agent, or further adding the electrical conductivity adjusting agent.

(Dispersing Medium)

The polishing composition according to an embodiment of the present invention further contains a dispersing medium (solvent). The dispersing medium contains water. The dispersing medium acts to disperse or dissolve each component.

The dispersing medium is not particularly limited as long as it contains water. A content of water in the dispersing medium is not particularly limited, but is preferably 50% by mass or more, and more preferably 90% by mass or more, with respect to a total mass of the dispersing medium, and it is more preferable that only water is contained. Water is preferably water containing as little impurities as possible, and is preferably water in which a total content of a transition metal ion is 100 ppb or less, from the viewpoint of preventing contamination of an object to be cleaned or inhibition of an action of other components. Here, the purity of water can be increased by, for example, a removal of impurity ions using an ion exchange resin, a removal of foreign substances by a filter, and an operation such as distillation or the like. Specifically, it is preferable to use, for example, deionized water (ion exchange water), pure water, ultrapure water, distilled water, and the like, as water.

In addition, in a case where the dispersing medium can improve dispersibility or solubility of each component, the dispersing medium may be a mixed solvent of water and an organic solvent. The organic solvent is not particularly limited, but a known organic solvent can be used. In the case of the mixed solvent of water and an organic solvent, the organic solvent is preferably miscible with water. In a case where an organic solvent is used, a mixed solvent may be prepared by mixing water and the organic solvent with each other and then each component may be added to and mixed with the mixed solvent, or each component may be dispersed or dissolved in the organic solvent and then mixed with water. Note that the organic solvents can be used alone or in combination of two or more.

(Other Components)

The polishing composition according to an embodiment of the present invention may further contain other components within a range in which the effects of the present invention are not impaired. The other components are not particularly limited, but may be appropriately selected from various components used in a known polishing composition, such as a wetting agent, a surfactant, a chelating agent, an antiseptic agent, an antifungal agent, a dissolved gas, a reducing agent, and the like.

(Object to be Polished)

The polishing composition according to an embodiment of the present invention is not particularly limited, but can be applied for a known object to be polished used in the CMP field. Therefore, an aspect of the object to be polished is not particularly limited, but a layer which is a flat-plate-like member is preferred, a substrate including the layer is more preferred, and a semiconductor substrate is still more preferred. For example, examples thereof can include a substrate including a single layer, a substrate including a layer to be polished and another layer (for example, a support layer or another functional layer), and the like.

A surface to be polished of the object to be polished particularly preferably contains silicon nitride, from the viewpoint of significantly exerting the effects of the present invention. That is, the polishing composition according to an embodiment of the present invention is preferably used for polishing the object to be polished containing silicon nitride. In addition, the surface to be polished of the object to be polished preferably contains another material in addition to silicon nitride. The reason is that a high selection ratio of another material to silicon nitride can be obtained because the polishing composition according to an embodiment of the present invention has a high effect of inhibiting polishing of silicon nitride and shows a high polishing speed of the another material. The another material is not particularly limited, but for example, an object to be polished preferably further contains a silicon-containing material other than silicon nitride, or a constituent component containing a metal, a metal oxide, a metal nitride, or the like.

The silicon-containing material other than silicon nitride is not particularly limited, and examples thereof can include a material having a silicon-oxygen bond (for example, silicon oxide or the like), a material having a silicon-silicon bond (for example, polysilicon or the like), a material having a silicon-nitrogen bond other than silicon nitride, and the like. Here, the material having a silicon-oxygen bond is not particularly limited, and examples thereof can include silicon oxide, black diamond (BD) (SiOCH), fluorosilicate glass (FSG), hydrogen silsesquioxane (HSQ), CYCLOTENE, SiLK, methyl silsesquioxane (MSQ), and the like. In addition, the object to be polished having a silicon-silicon bond is not particularly limited, and examples thereof can include polycrystalline silicon (polysilicon, Poly-Si), amorphous silicon, single-crystalline silicon, n-type doped single-crystalline silicon, p-type doped single-crystalline silicon, a Si-based alloy such as SiGe, and the like. The material having a silicon-nitrogen bond other than silicon nitride is not particularly limited, and examples thereof can include silicon carbonitride (SiCN) and the like. Among them, the material having a silicon-silicon bond is preferred, and polysilicon is more preferred, from the viewpoint of being able to achieve polishing at a high polishing speed and further increasing the selection ratio of the another material to silicon nitride by using the polishing composition according to an embodiment of the present invention. In addition, among them, in a case where the polishing composition further contains the silicon oxide polishing inhibitor, the material having a silicon-oxygen bond is preferred, and silicon oxide is more preferred. The reason is that both the effect of increasing the selection ratio of the another material to silicon nitride and the effect of increasing the selection ratio of the another material other than silicon oxide to silicon oxide are implemented. Note that a film containing silicon oxide is not particularly limited, and examples thereof can include a film including tetraethyl orthosilicate (TEOS) type silicon oxide (in the present specification, also referred to as "TEOS-SiO$_2$") produced by using tetraethyl orthosilicate as a precursor, a high density plasma (HDP) film, an undoped silicate glass (USG) film, a phosphorus silicate glass (PSG) film, a boron-phospho-silicate glass (BPSG) film, a rapid thermal oxidation (RTO) film, and the like. As silicon oxide, TEOS-SiO$_2$ is particularly preferred. Therefore, as the object to be polished, an object to be polished further containing silicon oxide (preferably, TEOS-SiO$_2$) in addition to silicon nitride is particularly preferred.

In addition, the metal is not particularly limited, and examples thereof can include copper, aluminum, hafnium, cobalt, nickel, titanium, tungsten, and alloys thereof, and the like. The metal oxide is not particularly limited, and examples thereof can include alumina and the like. The metal nitride is not particularly limited, and examples thereof can include titanium nitride, tantalum nitride, and the like. Among them, a metal nitride is preferred, and titanium nitride is more preferred, as another material, from the viewpoint of being able to achieve polishing at a higher polishing speed and further increasing the selection ratio of the another material to silicon nitride by using the polishing composition according to an embodiment of the present invention. As the object to be polished, an object to be polished further containing titanium nitride in addition to silicon nitride is particularly preferred.

In this respect, as the object to be polished, an object to be polished further containing silicon oxide (preferably, TEOS-SiO$_2$) and titanium nitride in addition to silicon nitride is particularly preferred.

(Selection Ratio of Another Material to Silicon Nitride)

In a polishing method using the polishing composition according to an embodiment of the present invention, in a case where an object to be polished further containing another material in addition to silicon nitride is polished, a selection ratio of the another material to silicon nitride is not particularly limited, but is preferably high. For example, in a case where the another material is titanium nitride, the selection ratio of titanium nitride to silicon nitride is not particularly limited, but is preferably 40 or more, more preferably 50 or more, still more preferably 70 or more, further still more preferably 90 or more, particularly preferably 100 or more, further particularly preferably 110 or more, extremely preferably 150 or more, and most preferably 180 or more.

In addition, for example, in a case where the another material is silicon oxide, the selection ratio of titanium nitride to silicon oxide is not particularly limited, but preferably exceeds 15, more preferably 20 or more, and still more preferably 25 or more. Note that the selection ratio of the another material to silicon nitride can be determined by dividing the polishing speed of the another material by the polishing speed of silicon nitride.

<Production Method of Polishing Composition>

Another aspect of the present invention relates to a production method of a polishing composition, the production method including mixing cationically modified silica particles, a non-aromatic crosslinked cyclic compound having an organic acid group or a group of a salt thereof, and water with each other.

In addition, in the production method of a polishing composition according to an embodiment of the present invention, the silicon oxide polishing inhibitor described above or other components may be further mixed. An example of the production method according to a preferred embodiment of the present invention can include a method further including mixing a compound represented by the above general formula 2.

A method of mixing the respective components with each other is not particularly limited, but a known method can be appropriately used. In addition, a mixing temperature is not particularly limited, but is generally preferably 10° C. to 40° C., and heating may be performed to increase a rate of dissolution. In addition, a mixing time is also not particularly limited.

Note that in the production method of a polishing composition, preferred embodiments (type, characteristic, structure, addition amount, and the like) of each component are the same as that described for each component of the polishing composition. In addition, various features such as preferred characteristics of a polishing composition to be produced are also the same as that described for the polishing composition.

<Polishing Method>

Still another aspect of the present invention relates to a polishing method of polishing an object to be polished by using the polishing composition, or by producing a polishing composition by the production method and using the produced polishing composition.

The object to be polished in the polishing method is the same as that described for the polishing composition.

A polishing apparatus and polishing condition are not particularly limited, but a known apparatus and condition can be appropriately used.

As the polishing apparatus, it is possible to use a general polishing apparatus equipped with a holder for holding an object to be polished, a motor capable of changing a rotation speed, and the like, and having a polishing table to which a polishing pad (polishing cloth) may be attached. As the polishing apparatus, either a one-side polishing apparatus or a double-side polishing apparatus may be used. As the polishing pad, a general nonwoven fabric, polyurethane, a porous fluororesin, or the like can be used without particular limitation. It is preferable that the polishing pad is subjected to groove processing so that a polishing liquid is accumulated therein.

The polishing condition is not particularly limited, but an appropriate condition can be appropriately set depending on characteristics of the polishing composition and the object to be polished. A polishing load (polishing pressure or processing pressure) is not particularly limited, but is generally preferably 0.1 psi or more and 10 psi or less, more preferably 0.5 psi or more and 8 psi or less, and still more preferably 1 psi or more and 6 psi or less, per unit area. Within this range, damage of a substrate due to a load, defects such as scratches on a surface, or the like can be suppressed while implementing a high polishing speed. Each of a table rotation speed and a carrier rotation speed is not particularly limited, but is generally preferably 10 rpm or more 500 rpm or less, more preferably 20 rpm or more and 300 rpm or less, and still more preferably 30 rpm or more and 200 rpm or less. A method of supplying the polishing composition is also not particularly limited, but a method of continuously supplying (flowing) the polishing composition with a pump or the like may be adopted. A supply amount of the polishing composition (a flow rate of the polishing composition) is not particularly limited as long as it is a supply amount covering the entire object to be polished, but is generally preferably 100 mL/min or more and 5,000 mL/min or less. The polishing time is not particularly limited as long as it is appropriately set to obtain a desired polishing result, but is generally preferably 5 seconds or longer and 180 seconds or shorter. In addition, the polishing is preferably performed using in-situ dressing. Here, the in-situ dressing refers to a technique for polishing and dressing a pad. According to the in-situ dressing, the polishing speed with respect to the polishing time can be more uniformly increased, and controllability of the polishing can be further improved. As an in-situ dressing member, a conditioner such as a diamond dresser or the like is preferred.

The object to be polished after the completion of the polishing may be cleaned with water, and a surface thereof may be dried by removing water droplets attached to the surface thereof by a spin drier, an air blow, or the like.

In the polishing method according to an embodiment of the present invention, in a case where an object to be polished further containing another material in addition to silicon nitride is polished, a selection ratio of the another material to silicon nitride is not particularly limited, but is preferably high. A preferred range of the selection ratio of titanium nitride to silicon nitride is the same as that described for the polishing composition. In addition, a preferred range of the selection ratio of titanium nitride to silicon oxide is the same as that described for the polishing composition.

<Manufacturing Method of Semiconductor Substrate>

Still another aspect of the present invention relates to a manufacturing method of a semiconductor substrate, the manufacturing method including polishing a substrate material (polishing step), wherein the object to be polished is the substrate material. That is, the aspect relates to a manufacturing method of a semiconductor substrate, the manufacturing method including: polishing a substrate material used for forming a semiconductor substrate, which is an object to be polished containing titanium nitride by using the polishing composition, or by producing a polishing composition by the production method and using the produced polishing composition.

Note that in the manufacturing method, steps that can be adopted in a known manufacturing method of a semiconductor substrate can be appropriately adopted as other steps.

Although embodiments of the present invention have been described in detail, however, they are illustrative and exemplary but not restrictive. It is clear that the scope of the present invention should be interpreted by the appended claims.

The present invention includes the following aspects and embodiments, but is not limited thereto:

1. A polishing composition containing cationically modified silica particles (at least one type of cationically modified silica particles), a non-aromatic crosslinked cyclic compound having an organic acid group or a group of a salt thereof, and water;

2. The polishing composition according to 1. above, wherein the non-aromatic crosslinked cyclic compound having an organic acid group or a group of a salt thereof is a compound represented by the above general formula 1;

3. The polishing composition according to 2. above, wherein in the general formula 1, at least one of $Z_1$, $Z_2$, $Z_3$, and $Z_4$ is C=O;

4. The polishing composition according to 2. or 3. above, wherein in the general formula 1, at least one of $R_1$, $R_1'$, $R_2$, $R_2'$, $R_3$, $R_3'$, $R_4$, $R_4'$, $R_5$, $R_6$, $R_7$, and $R_8$ is an organic acid group or a group of a salt thereof, or an alkyl group substituted with an organic acid group or a group of a salt thereof;

5. The polishing composition according to any one of 1. to 4. above, wherein the organic acid group or the group of the salt thereof is at least one selected from the group consisting of a carboxyl group, a group of a salt of a carboxyl group, a sulfo group, a group of a salt of a sulfo group, a phosphonic acid group, a group of a salt of a phosphonic acid group, a phosphoric acid group, and a group of a salt of a phosphoric acid group;

6. The polishing composition according to any one of 1. to 5. above, wherein a zeta potential of the cationically modified silica particles is a positive value;

7. The polishing composition according to any one of 1. to 6. above, further containing a compound represented by the above general formula 2;

8. The polishing composition according to any one of 1. to 7. above, further containing an oxidizing agent;

9. The polishing composition according to any one of 1. to 8. above, wherein a pH is less than 7;

10. The polishing composition according to any one of 1. to 9. above, wherein an electrical conductivity is 30 µS/cm or more and 2 mS/cm or less; 11. The polishing composition according to any one of 1. to 10. above, wherein the polishing composition is used for polishing an object to be polished containing silicon nitride;

12. The polishing composition according to 11. above, wherein the polishing composition is used for polishing an object to be polished further containing titanium nitride;

13. The polishing composition according to 11. or 12. above, wherein the polishing composition is used for polishing an object to be polished further containing silicon oxide;

14. A production method of a polishing composition, including mixing cationically modified silica particles (at least one type of cationically modified silica particles), a non-aromatic crosslinked cyclic compound having an organic acid group or a group of a salt thereof, and water with each other;

15. The production method of a polishing composition according to 14. above, further including mixing a compound represented by the above general formula 2;

16. A polishing method of polishing an object to be polished by using the polishing composition according to any one of 1. to 13. above, or by producing a polishing composition by the production method according to 14. or 15. above and using the produced polishing composition; and 17. A manufacturing method of a semiconductor substrate, including polishing a substrate material by the polishing method according to 16. above, wherein the object to be polished is the substrate material.

Examples

The present invention will be described in more detail with reference to the following Examples and Comparative Examples. However, the technical scope of the present invention is not limited to only the following Examples. Unless otherwise specified, "%" and "part(s)" refer to "% by mass" and "part(s) by mass", respectively. In addition, in the following Examples, unless otherwise specified, operations are performed under a condition of room temperature (25° C.)/relative humidity of 40 to 50% RH.

<Preparation 1 of Polishing Composition>

(Polishing Composition 1)

To pure water as a dispersing medium, colloidal silica A (average primary particle size: 35 nm, average secondary particle size: 70 nm, density of silanol group: 1.5/nm², degree of association: 2.0) having an amino group immobilized on a surface thereof as abrasive grains, (+)-10-camphorsulfonic acid as a SiN polishing inhibitor, hydrogen peroxide as an oxidizing agent, and nitric acid as a pH adjusting agent were added, to prepare a polishing composition 1.

Here, an addition amount of the colloidal silica A as abrasive grains was 3% by mass with respect to the prepared polishing composition. An addition amount of the (+)-10-camphorsulfonic acid as a SiN polishing inhibitor was 0.05% by mass with respect to the prepared polishing composition. An addition amount of the hydrogen peroxide as an oxidizing agent was 0.12% by mass with respect to the prepared polishing composition. Here, the hydrogen peroxide was added using a hydrogen peroxide aqueous solution having a concentration of 31% by mass. The hydrogen peroxide aqueous solution was added in an amount such that the amount of hydrogen peroxide contained therein was the above addition amount. An addition amount of the nitric acid as a pH adjusting agent was set so that a pH of the prepared polishing composition was 3.0. Here, a pH of the polishing composition 1 (temperature: 25° C.) was measured by a pH meter (trade name: LAQUA (registered trademark), manufactured by Horiba, Ltd.).

In addition, an electrical conductivity (EC) of the prepared polishing composition 1 was measured. The electrical conductivity of the polishing composition 1 (temperature: 25° C.) was measured by a desktop electrical conductivity meter (manufactured by Horiba, Ltd., model: DS-71). The electrical conductivity (EC) of the polishing composition 1 was 0.69 mS/cm.

In addition, a zeta potential of the abrasive grains in the prepared polishing composition 1 was measured. First, the polishing composition was supplied to ELS-Z2 (manufactured by Otsuka Electronics Co., Ltd.), and measurement was performed using a flow cell at a measurement temperature of 25° C. by a laser Doppler method (electrophoretic light scattering measurement method). Then, the zeta potential (mV) of the abrasive grains in the polishing composition was calculated by analyzing the obtained data by the Smoluchowski equation. The zeta potential of the abrasive grains in the polishing composition 1 was 40 mV.

(Polishing Compositions 2 to 12)

Each polishing composition was prepared in the same manner as that in the preparation of the polishing composition 1, except that the type and addition amount (concentration) of each component, and the pH of the polishing composition were changed as shown in Table 1. Here, in the preparation of each polishing composition, the pH adjusting agent was added so that the pH of the prepared polishing composition was a value as shown in Table 1. Note that each of the pH, the electrical conductivity, and the zeta potential of the abrasive grains was also measured in the same manner as that of the polishing composition 1.

(Polishing Compositions 13 and 14)

Each polishing composition was prepared in the same manner as that in the preparation of the polishing composition 1, except that the type and addition amount (concentration) of each component, and the pH of the polishing composition were changed as shown in Table 1. Here, as abrasive grains, colloidal silica B (average primary particle size: 13.8 nm, average secondary particle size: 33 nm, density of silanol group: $2.2/nm^2$, degree of association: 2.39) having a sulfo group immobilized on a surface thereof was used. Note that each of the pH, the electrical conductivity, and the zeta potential of the abrasive grains was also measured in the same manner as that of the polishing composition 1.

<Polishing Method 1>

(Polishing Apparatus and Polishing Condition)

A surface of an object to be polished was polished by using each of the prepared polishing compositions by the following apparatus under the following conditions.

As the object to be polished, a TiN blanket wafer which was a titanium nitride film (TiN film) having a thickness of 2,500 Å formed on a substrate surface and a SiN blanket wafer which was a silicon nitride film (SiN film) having a thickness of 2,000 Å formed on a substrate surface were used.

[Polishing Apparatus and Polishing Condition]

Polishing apparatus: EJ-380IN-CH (manufactured by Engis Japan Corporation)

Polishing pad: IC1000 (manufactured by Nitta Haas Inc. (current: NITTA DuPont Incorporated.))

Polishing pressure (processing pressure): 3.43 psi (1 psi=6,894.76 Pa)

Rotation speed of polishing table: 60 rpm (60 rpm=1 $s^{-1}$)

Supply amount of polishing composition: 100 mL/min

Polishing time: 60 sec

Conditioner (In-situ dressing member): diamond dresser (SDT-100, manufactured by Noritake Co., Limited)

<Evaluation 1>

(Measurement of Polishing Speed)

Each of the objects to be polished was polished by using each polishing composition, and a polishing speed (Å/min) of the TiN film and a polishing speed (Å/min) of the SiN film were measured. The polishing speed of the TiN film was determined by dividing a difference in thickness (Å) of the TiN blanket wafer before and after polishing measured using a sheet resistance measuring device based on a DC-four probe method by the polishing time (min). The polishing speed of the SiN film was determined by dividing a difference in thickness (Å) of the SiN blanket wafer before and after polishing measured using a light interference type film thickness measurement apparatus (model: Filmetrics F50, manufactured by Filmetrics Japan, Inc.) by the polishing time (min). Note that 1 Å is 0.1 nm. The evaluation results are shown in Table 2.

TABLE 1

Preparation and physical properties of polishing composition

| Polishing composition | Abrasive grains | | | SiN polishing inhibitor or comparative compound | | Oxidizing agent ($H_2O_2$) | pH adjusting agent Type | Physical properties | | Reference |
|---|---|---|---|---|---|---|---|---|---|---|
| | Type of colloidal silica | Concentration [% by mass] | Zeta potential [mV] | Type | Concentration [% by mass] | Concentration [% by mass] | | pH | Electrical conductivity [mS/cm] | |
| 1 | A | 3 | 40 | (+)-10-camphorsulfonic acid | 0.05 | 0.12 | Nitric acid | 3.0 | 0.69 | Example |
| 2 | A | 3 | 40 | (+)-10-camphorsulfonic acid | 0.1 | 0.12 | Nitric acid | 3.0 | 0.79 | Example |

TABLE 1-continued

Preparation and physical properties of polishing composition

| | Abrasive grains | | | SiN polishing inhibitor or comparative compound | | Oxidizing agent (H₂O₂) | pH adjusting agent | Physical properties | | |
|---|---|---|---|---|---|---|---|---|---|---|
| Polishing composition | Type of colloidal silica | Concentration [% by mass] | Zeta potential [mV] | Type | Concentration [% by mass] | Concentration [% by mass] | Type | pH | Electrical conductivity [mS/cm] | Reference |
| 3 | A | 3 | 40 | (+)-10-camphor-sulfonic acid | 0.2 | 0.12 | KOH | 3.0 | 1.00 | Example |
| 4 | A | 3 | 40 | None | 0 | 0.12 | Acetic acid | 3.0 | 0.59 | Comparative Example |
| 5 | A | 3 | 40 | None | 0 | 0.12 | Acetic acid | 3.5 | 0.43 | Comparative Example |
| 6 | A | 3 | 40 | None | 0 | 0.12 | Acetic acid | 4.0 | 0.32 | Comparative Example |
| 7 | A | 3 | 40 | Benzenesulfonic acid | 0.2 | 0.12 | Nitric acid | 3.0 | 0.76 | Comparative Example |
| 8 | A | 3 | 40 | None | 0 | 0.12 | sulfuric acid | 3.0 | 0.52 | Comparative Example |
| 9 | A | 3 | 40 | Sulfanilic acid | 0.1 | 0.12 | Nitric acid | 3.0 | 0.92 | Comparative Example |
| 10 | A | 3 | 40 | Naphthalenetri-sulfonic acid | 0.1 | 0.12 | Nitric acid | 3.0 | 2.51 | Comparative Example |
| 11 | A | 3 | 40 | Camphanic acid | 0.1 | 0.12 | Nitric acid | 3.0 | 0.61 | Example |
| 12 | A | 3 | 40 | Ketopinic acid | 0.1 | 0.12 | Nitric acid | 3.0 | 0.64 | Example |
| 13 | B | 3 | −40 | None | 0.1 | 0.12 | Nitric acid | 3.0 | 0.62 | Comparative Example |
| 14 | B | 3 | −40 | (+)-10-camphor-sulfonic acid | 0.1 | 0.12 | Nitric acid | 3.0 | 0.66 | Comparative Example |

TABLE 2

Polishing speed and selection ratio in polishing performed by using polishing composition

| Polishing composition | Polishing speed of TiN film [Å/min] | Polishing speed of SiN film [Å/min] | Polishing speed of TiN film/Polishing speed of SiN film | Reference |
|---|---|---|---|---|
| 1 | 2158 | 24 | 91.1 | Example |
| 2 | 2122 | 18 | 117.9 | Example |
| 3 | 2019 | 11 | 184.1 | Example |
| 4 | 2090 | 67 | 31.2 | Comparative Example |
| 5 | 1832 | 60 | 30.5 | Comparative Example |
| 6 | 1814 | 73 | 24.8 | Comparative Example |
| 7 | 1968 | 54 | 36.7 | Comparative Example |
| 8 | 1768 | 97 | 18.2 | Comparative Example |
| 9 | 1657 | 192 | 8.6 | Comparative Example |
| 10 | 2083 | 389 | 5.4 | Comparative Example |
| 11 | 1987 | 21 | 94.6 | Example |
| 12 | 2011 | 26 | 77.3 | Example |
| 13 | 2852 | 285 | 10.0 | Comparative Example |
| 14 | 2934 | 299 | 9.8 | Comparative Example |

From the results shown in Tables 1 and 2, it was confirmed that in the case of the polishing compositions 1 to 3, 11, and 12 according to Examples in which the cationically modified silica particles and the SiN polishing inhibitor of the present invention were contained, polishing of the SiN film was remarkably inhibited. In addition, it was also confirmed that a selection ratio of the TiN film to the SiN film was remarkably increased while maintaining a high polishing speed of the TiN film. From these results, it could be seen that the polishing compositions 1 to 3, 11, and 12 according to Examples were particularly suitable for polishing the object to be polished further containing titanium nitride in addition to silicon nitride.

On the other hand, it was confirmed that in the case of the polishing compositions 4 to 6 and 8 according to Comparative Examples in which the SiN polishing inhibitor was not contained, the polishing compositions 7, 9, and 10 according to Comparative Examples in which a comparative compound having a structure different from that of the SiN polishing inhibitor of the present invention was contained, the polishing composition 14 according to Comparative Example in which an anion-modified silica particles were contained instead of the cationically modified silica particles, and the polishing composition 13 according to Comparative Example in which an anion-modified silica particles were contained instead of the cationically modified silica particles and the SiN polishing inhibitor was not contained, the effect of inhibiting polishing of the SiN film was deteriorated as compared with the polishing compositions 1 to 3, 11, and 12 according to Examples. From the results, it was confirmed that the selection ratio of the TiN film to the SiN film was also low.

<Preparation 2 of Polishing Composition>
(Polishing Composition 15)

To pure water as a dispersing medium, colloidal silica C (average primary particle size: 23 nm, average secondary particle size: 50 nm, density of silanol group: 3.6/nm², degree of association: 2.2, cocoon-like shape) having an amino group immobilized on a surface thereof as abrasive grains, (+)-10-camphorsulfonic acid as a SiN polishing inhibitor, 4-acetylmorpholine as a silicon oxide polishing inhibitor, and hydrogen peroxide as an oxidizing agent were added, to prepare a polishing composition 15.

Here, an addition amount of the colloidal silica C as abrasive grains was 1.8% by mass with respect to the prepared polishing composition. An addition amount of the (+)-10-camphorsulfonic acid as a SiN polishing inhibitor was set so that a pH of the prepared polishing composition was 3.0. An addition amount of the 4-acetylmorpholine as a silicon oxide polishing inhibitor was 0.13% by mass with respect to the prepared polishing composition. An addition amount of the hydrogen peroxide as an oxidizing agent was 0.09% by mass with respect to the prepared polishing composition. Here, the hydrogen peroxide was added using a hydrogen peroxide aqueous solution having a concentration of 31% by mass. The hydrogen peroxide aqueous solution was added in an amount such that the amount of hydrogen peroxide contained therein was the above addition amount. Here, a pH of the polishing composition 15 (temperature: 25° C.) was measured by a pH meter (trade name: LAQUA (registered trademark), manufactured by Horiba, Ltd.).

In addition, an electrical conductivity (EC) of the prepared polishing composition 15 was measured. The electrical conductivity of the polishing composition 15 (temperature: 25° C.) was measured by a desktop electrical conductivity meter (manufactured by Horiba, Ltd., model: DS-71). The electrical conductivity (EC) of the polishing composition 15 was 0.6 mS/cm.

In addition, a zeta potential of the abrasive grains in the prepared polishing composition 15 was measured. First, the polishing composition was supplied to ELS-Z2 (manufactured by Otsuka Electronics Co., Ltd.), and measurement was performed using a flow cell at a measurement temperature of 25° C. by a laser Doppler method (electrophoretic light scattering measurement method). Then, the zeta potential (mV) of the abrasive grains in the polishing composition was calculated by analyzing the obtained data by the Smoluchowski equation. The zeta potential of the abrasive grains in the polishing composition 15 was 21 mV.

(Polishing Compositions 16 to 18)

Each polishing composition was prepared in the same manner as that in the preparation of the polishing composition 15, except that the type and addition amount (concentration) of each component and the pH of the polishing composition were changed as shown in Table 3. Here, in the preparation of each polishing composition, the (+)-10-camphorsulfonic acid as a SiN polishing inhibitor was added so that the pH of the prepared polishing composition was a value as shown in Table 3. Note that each of the pH, the electrical conductivity, and the zeta potential of the abrasive grains was also measured in the same manner as that of the polishing composition 15.

(Polishing Composition 19)

A polishing composition 19 was prepared in the same manner as that in the preparation of the polishing composition 15, except that nitric acid as a pH adjusting agent was added so that a pH of the prepared polishing composition was 3.0 without adding the (+)-10-camphorsulfonic acid as a SiN polishing inhibitor. Note that each of the pH, the electrical conductivity, and the zeta potential of the abrasive grains was also measured in the same manner as that of the polishing composition 15.

<Polishing Method 2>

(Polishing apparatus and polishing condition) A surface of an object to be polished was polished by using each of the prepared polishing compositions by the following apparatus under the following conditions. As the object to be polished, a TiN blanket wafer which was a titanium nitride film (TiN film) having a thickness of 2,500 Å formed on a substrate surface, a SiN blanket wafer which was a silicon nitride film (SiN film) having a thickness of 2,000 Å formed on a substrate surface, and a TEOS-SiO$_2$ blanket wafer which was a TEOS-SiO$_2$ film having a thickness of 10,000 Å formed on a substrate surface were used. Note that a size of the used blanket wafer was a diameter of 300 mm (size of 12 inches).

[Polishing Apparatus and Polishing Condition]

Polishing apparatus: one-side polishing apparatus, FREX300E (manufactured by Ebara Corporation)

Polishing pad: IC1000 (manufactured by Nitta Haas Inc. (current: NITTA DuPont Incorporated.))

Polishing pressure (processing pressure): 4.0 psi (1 psi=6, 894.76 Pa)

Rotation speed of polishing table: 110 rpm (60 rpm=1 s$^{-1}$)

Supply amount of polishing composition: 250 mL/min

Polishing time: 60 sec

Conditioner (In-situ dressing member): diamond dresser (SDT-100, manufactured by Noritake Co., Limited)

<Evaluation 2>

(Measurement of Polishing Speed)

Each of the objects to be polished was polished by using each polishing composition, and a polishing speed (Å/min) of the TiN film, a polishing speed (Å/min) of the SiN film, and a polishing speed (Å/min) of the TEOS-SiO$_2$ film were measured. The polishing speed of the TiN film was determined by dividing a difference in thickness (Å) of the TiN blanket wafer before and after polishing measured using a sheet resistance measuring device based on a DC-four probe method by the polishing time (min). The polishing speed of the SiN film was determined by dividing a difference in thickness (Å) of the SiN blanket wafer before and after polishing measured using a light interference type film thickness measurement apparatus (model: Filmetrics F50, manufactured by Filmetrics Japan, Inc.) by the polishing time (min). The polishing speed of the TEOS-SiO$_2$ film was determined by dividing a difference in thickness (Å) of the TEOS blanket wafer immediately after polishing measured using a light interference type film thickness measurement apparatus (model: ASET-f5x, manufactured KLA-Tencor Corporation) by the polishing time (min). Note that 1 Å is 0.1 nm. The evaluation results are shown in Table 4.

(Stability of Polishing Composition)

The presence or absence of precipitation of the abrasive grains in each of the prepared polishing compositions 15 to 19 immediately after preparation (after 10 minutes from preparation) was visually confirmed. In addition, the polishing composition was allowed to stand in a constant temperature storage at 25° C., and after 3 months, the presence or absence of precipitation of the abrasive grains was visually confirmed. The evaluation results are shown in Table 4.

TABLE 3

Preparation and physical properties of polishing composition

| Polishing composition | Abrasive grains | | | SiN polishing inhibitor Type | Silicon oxide polishing inhibitor | | Oxidizing agent (H$_2$O$_2$) Concentration [% by mass] | pH adjusting agent Type | Physical properties | | Reference |
|---|---|---|---|---|---|---|---|---|---|---|---|
| | Type of colloidal silica | Concentration [% by mass] | Zeta potential [mV] | | Type | Concentration [% by mass] | | | pH | Electrical conductivity [mS/cm] | |
| 15 | C | 1.8 | 21 | (+)-10-camphor-sulfonic acid | 4-Acetyl-morpholine | 0.13 | 0.09 | None | 3.0 | 0.6 | Example |
| 16 | C | 1.8 | 21 | (+)-10-camphor-sulfonic acid | 4-Acetyl-morpholine | 0.26 | 0.09 | None | 3.0 | 0.6 | Example |
| 17 | C | 1.8 | 20 | (+)-10-camphor-sulfonic acid | 4-Acryloyl-morpholine | 0.28 | 0.09 | None | 3.0 | 0.6 | Example |
| 18 | C | 1.8 | 22 | (+)-10-camphor-sulfonic acid | None | 0 | 0.09 | None | 3.0 | 0.6 | Example |
| 19 | C | 1.8 | 23 | None | None | 0 | 0.09 | Nitric acid | 3.0 | 0.6 | Comparative Example |

TABLE 4

Polishing speed, selection ratio, and stability of polishing composition in polishing performed by using polishing composition

| Polishing composition | Polishing speed | | | Selection ratio | | Stability | | Reference |
|---|---|---|---|---|---|---|---|---|
| | Polishing speed of TiN film [Å/min] | Polishing speed of SiN film [Å/min] | Polishing speed of TEOS-SiO$_2$ film [Å/min] | Polishing speed of TiN film/ Polishing speed of SiN film | Polishing speed of TiN film/ Polishing speed of TEOS-SiO$_2$ film | Aggregation of abrasive grains immediately after preparation | Aggregation of abrasive grains after 3 months storage at 25° C. | |
| 15 | 1043 | 20 | 51 | 52 | 20 | None | None | Example |
| 16 | 1057 | 22 | 45 | 48 | 23 | None | None | Example |
| 17 | 1054 | 24 | 42 | 44 | 25 | None | None | Example |
| 18 | 1080 | 20 | 73 | 54 | 15 | None | None | Example |
| 19 | 1067 | 112 | 70 | 10 | 15 | None | None | Comparative Example |

From the results shown in Tables 3 and 4, it was confirmed that in the case of the polishing compositions 15 to 18 according to Examples in which the cationically modified silica particles and the SiN polishing inhibitor of the present invention were contained, polishing of the SiN film was remarkably inhibited. In addition, it was also confirmed that a selection ratio of the TiN film to the SiN film was remarkably increased while maintaining a high polishing speed of the TiN film. From these results, it could be seen that the polishing compositions 15 to 18 according to Examples were particularly suitable for polishing the object to be polished further containing titanium nitride in addition to silicon nitride. In addition, it was also confirmed that stability of each of the polishing compositions was excellent.

Further, it was confirmed that in the case of the polishing compositions 15 to 17 according to Examples in which the cationically modified silica particles, the SiN polishing inhibitor of the present invention, and the silicon oxide polishing inhibitor of the present invention were contained, the polishing of the SiN film was remarkably inhibited, and the polishing of the silicon oxide film was also remarkably inhibited. In addition, it was confirmed that the selection ratio of the TiN film to the silicon oxide film was also remarkably increased as well as the selection ratio of the TiN film to the SiN film while maintaining a high polishing speed of the TiN film. From these results, it could be seen that the polishing compositions 15 to 17 according to Examples were particularly suitable for polishing the object to be polished further containing titanium nitride in addition to silicon oxide. In addition, it could be seen that the polishing compositions 15 to 17 according to Examples were particularly suitable for polishing the object to be polished further containing silicon oxide and titanium nitride in addition to silicon nitride.

On the other hand, it was confirmed that in the case of the polishing composition 19 according to Comparative Example in which the SiN polishing inhibitor was not contained, the effect of inhibiting polishing of the SiN film was deteriorated as compared with the polishing compositions 15 to 18 according to Examples. From the results, it was confirmed that the selection ratio of the TiN film to the SiN film was also low.

The present application is based on the Japanese patent application No. 2020-54516 filed on Mar. 25, 2020, and the Japanese patent application No. 2020-198712 filed on Nov. 30, 2020, and a disclosed content thereof is incorporated herein as a whole by reference.

What is claimed is:

1. A polishing composition comprising cationically modified silica particles, a non-aromatic crosslinked cyclic compound having an organic acid group or a group of a salt thereof, and water.

2. The polishing composition according to claim 1, wherein the non-aromatic crosslinked cyclic compound having an organic acid group or a group of a salt thereof is a compound represented by the following general formula 1:

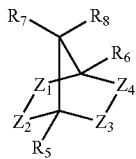

(General formula 1)

in the above general formula 1,
$Z_1$ is $CR_1R_1'$, C=O, or O,
$Z_2$ is $CR_2R_2'$, C=O, or O,
$Z_3$ is $CR_3R_3'$, C=O, or O,
$Z_4$ is $CR_4R_4'$, C=O, or O,
$R_1$, $R_1'$, $R_2$, $R_2'$, $R_3$, $R_3'$, $R_4$, $R_4'$, $R_5$, $R_6$, $R_7$, and $R_8$ are each independently a hydrogen atom, a deuterium atom, a halogen atom, a substituted or unsubstituted alkyl group, a substituted or unsubstituted alkenyl group, a substituted or unsubstituted alkynyl group, a substituted or unsubstituted alkoxy group, a substituted or unsubstituted polyoxyalkylene group, or an organic acid group or a group of a salt thereof,
in a case where at least one of the $R_1$, $R_1'$, $R_2$, $R_2'$, $R_3$, $R_3'$, $R_4$, $R_4'$, $R_5$, $R_6$, $R_7$, and $R_8$ is a substituted group, a substituent is each independently a deuterium atom, a halogen atom, an unsubstituted alkyl group, an unsubstituted alkenyl group, an unsubstituted alkynyl group, an unsubstituted alkoxy group, an unsubstituted polyoxyalkylene group, or an organic acid group or a group of a salt thereof, and
at least one of the $R_1$, $R_1'$, $R_2$, $R_2'$, $R_3$, $R_3'$, $R_4$, $R_4'$, $R_5$, $R_6$, $R_7$, and $R_8$ comprises an organic acid group or a group of a salt thereof.

3. The polishing composition according to claim 2, wherein in the general formula 1, at least one of the $Z_1$, $Z_2$, $Z_3$, and $Z_4$ is C=O.

4. The polishing composition according to claim 2, wherein in the general formula 1, at least one of the $R_1$, $R_1'$, $R_2$, $R_2'$, $R_3$, $R_3'$, $R_4$, $R_4'$, $R_5$, $R_6$, $R_7$, and $R_8$ is an organic acid group or a group of a salt thereof, or an alkyl group substituted with an organic acid group or a group of a salt thereof.

5. The polishing composition according to claim 1, wherein the organic acid group or the group of the salt thereof is at least one selected from the group consisting of a carboxyl group, a group of a salt of a carboxyl group, a sulfo group, a group of a salt of a sulfo group, a phosphonic acid group, a group of a salt of a phosphonic acid group, a phosphoric acid group, and a group of a salt of a phosphoric acid group.

6. The polishing composition according to claim 1, wherein a zeta potential of the cationically modified silica particles is a positive value.

7. The polishing composition according to claim 1, further comprising a compound represented by the following general formula 2:

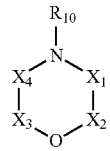

(General formula 2)

in the above general formula 2,
$X_1$ is $CR_{11}R_{11}'$ or C=O,
$X_2$ is $CR_{12}R_{12}'$ or C=O,
$X_3$ is $CR_{13}R_{13}'$ or C=O,
$X_4$ is $CR_{14}R_{14}'$ or C=O, and
$R_{10}$, $R_{11}$, $R_{11}'$, $R_{12}$, $R_{12}'$, $R_{13}$, $R_{13}'$, $R_{14}$, and $R_{14}'$ are each independently a hydrogen atom, a deuterium atom, a halogen atom, a substituted or unsubstituted hydrocarbon group, a substituted or unsubstituted oxyhydrocarbon group, a substituted or unsubstituted polyoxyalkylene group, or a group represented by the following general formula 3,

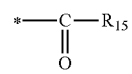

(General formula 3)

in the above general formula 3,
$R_{15}$ is a hydrogen atom, a deuterium atom, a halogen atom, or a substituted or unsubstituted hydrocarbon group,
* is a bond bonded to a ring-constituting nitrogen atom (N) of the above general formula 2, and
in a case where at least one of the $R_{10}$, $R_{11}$, $R_{11}'$, $R_{12}$, $R_{12}'$, $R_{13}$, $R_{13}'$, $R_{14}$, $R_{14}'$, and $R_{15}$ is a substituted group, a substituent is each independently a deuterium atom, a halogen atom, an unsubstituted oxyhydrocarbon group, or an unsubstituted polyoxyalkylene group.

8. The polishing composition according to claim 1, further comprising an oxidizing agent.

9. The polishing composition according to claim 1, wherein a pH is less than 7.

10. The polishing composition according to claim 1, wherein an electrical conductivity is 30 μS/cm or more and 2 mS/cm or less.

11. The polishing composition according to claim 1, wherein the polishing composition is used for polishing an object to be polished containing silicon nitride.

12. The polishing composition according to claim 11, wherein the polishing composition is used for polishing an object to be polished further containing titanium nitride.

13. The polishing composition according to claim 11, wherein the polishing composition is used for polishing an object to be polished further containing silicon oxide.

14. A production method of a polishing composition, comprising mixing cationically modified silica particles, a non-aromatic crosslinked cyclic compound having an organic acid group or a group of a salt thereof, and water with each other.

15. The production method of a polishing composition according to claim 14, further comprising mixing a compound represented by the following general formula 2:

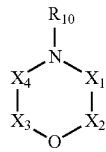

(General formula 2)

in the above general formula 2,
$X_1$ is $CR_{11}R_{11}'$ or C=O,
$X_2$ is $CR_{12}R_{12}'$ or C=O,
$X_3$ is $CR_{13}R_{13}'$ or C=O,
$X_4$ is $CR_{14}R_{14}'$ or C=O, and
$R_{10}$, $R_{11}$, $R_{11}'$, $R_{12}$, $R_{12}'$, $R_{13}$, $R_{13}'$, $R_{14}$, and $R_{14}'$ are each independently a hydrogen atom, a deuterium atom, a halogen atom, a substituted or unsubstituted hydrocarbon group, a substituted or unsubstituted oxyhydrocarbon group, a substituted or unsubstituted polyoxyalkylene group, or a group represented by the following general formula 3,

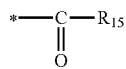

(General formula 3)

in the above general formula 3,
$R_{15}$ is a hydrogen atom, a deuterium atom, a halogen atom, or a substituted or unsubstituted hydrocarbon group,
* is a bond bonded to a ring-constituting nitrogen atom (N) of the above general formula 2, and
in a case where at least one of the $R_{10}$, $R_{11}$, $R_{11}'$, $R_{12}$, $R_{12}'$, $R_{13}$, $R_{13}'$, $R_{14}$, $R_{14}'$, and $R_{15}$ is a substituted group, a substituent is each independently a deuterium atom, a halogen atom, an unsubstituted oxyhydrocarbon group, or an unsubstituted polyoxyalkylene group.

16. A polishing method of polishing an object to be polished by using the polishing composition according to claim 1.

17. A manufacturing method of a semiconductor substrate, comprising polishing a substrate material by the polishing method according to claim 16,
wherein the object to be polished is the substrate material.

* * * * *